United States Patent
Huang et al.

(10) Patent No.: US 9,679,941 B2
(45) Date of Patent: Jun. 13, 2017

(54) IMAGE-SENSOR STRUCTURES

(71) Applicant: VisEra Technologies Company Limited, Hsin-Chu (TW)

(72) Inventors: Chih-Kuo Huang, Miaoli County (TW); Che-Sheng Lin, Hsinchu County (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 0 days.

(21) Appl. No.: 14/660,284

(22) Filed: Mar. 17, 2015

(65) Prior Publication Data

US 2016/0276393 A1 Sep. 22, 2016

(51) Int. Cl.
*H01L 27/146* (2006.01)

(52) U.S. Cl.
CPC .... *H01L 27/14685* (2013.01); *H01L 27/1462* (2013.01); *H01L 27/1464* (2013.01); *H01L 27/14618* (2013.01); *H01L 27/14621* (2013.01); *H01L 27/14627* (2013.01); *H01L 27/14636* (2013.01)

(58) Field of Classification Search
CPC .............................................. H01L 27/14645
See application file for complete search history.

(56) References Cited

U.S. PATENT DOCUMENTS

| | | | | |
|---|---|---|---|---|
| 2005/0041296 A1* | 2/2005 | Hsiao | ................ | H01L 27/14621 359/619 |
| 2013/0286592 A1* | 10/2013 | Tsuduki | ................ | H01L 23/055 361/707 |
| 2014/0339668 A1* | 11/2014 | Arima | ................ | H01L 23/4006 257/443 |

FOREIGN PATENT DOCUMENTS

| | | |
|---|---|---|
| JP | 2007-027318 A | 2/2007 |
| TW | 200421568 | 10/2004 |

OTHER PUBLICATIONS

Office Action of corresponding JP application No. 2015-174498 issued on Nov. 8, 2016 with its English translation (12 pages).

* cited by examiner

*Primary Examiner* — Peniel M Gumedzoe
*Assistant Examiner* — Christopher Johnson
(74) *Attorney, Agent, or Firm* — Muncy, Geissler, Olds & Lowe, P.C.

(57) ABSTRACT

An image-sensor structure is provided. The image-sensor structure includes a substrate having a first surface and a second surface and including a sensing area, a first metal layer formed above the first surface of the substrate and surrounding the sensing area, and a protection layer formed above the first surface of the substrate and overlying the sensing area and a part of the first metal layer to expose an exposed area of the first metal layer. The exposed area includes a first portion having a first width, a second portion having a second width, a third portion having a third width and a fourth portion having a fourth width.

11 Claims, 15 Drawing Sheets

IMAGE-SENSOR STRUCTURES

BACKGROUND OF THE INVENTION

Field of the Invention

The invention relates to an image-sensor structure, and more particularly to an image-sensor structure with a large exposed area of a back-side metal layer.

Description of the Related Art

An image sensor is a kind of semiconductor device that transforms optical images into electrical signals. Image sensors can be generally classified into charge coupled devices (CCDs) and complementary metal oxide semiconductor (CMOS) image sensors. Among these image sensors, a CMOS image sensor comprises a photodiode for detecting incident light and transforming it into electrical signals, and logic circuits for transmitting and processing the electrical signals.

During certain semiconductor manufacturing processes, such as an etching step (i.e. microlens protection (MP) etching step) for opening bond pads and scribe lines, electrostatic charges are generated and can accumulate on marginal back-side metal (BME). Unfortunately, when these electrostatic charges are discharged, they may pass through the substrate underneath, resulting in damage to the substrate due to the electrostatic discharge (ESD).

Therefore, development of a novel image-sensor structure which can effectively solve the problem of electrostatic discharge (ESD) during the microlens protection (MP) etching step for opening bond pads and scribe lines is desirable.

BRIEF SUMMARY OF THE INVENTION

One embodiment of the invention provides an image-sensor structure comprising a substrate having a first surface and a second surface and comprising a sensing area, a first metal layer formed above the first surface of the substrate and surrounding the sensing area, and a protection layer formed above the first surface of the substrate and overlying the sensing area and a part of the first metal layer to expose an exposed area of the first metal layer. The exposed area comprises a first portion having a first width, a second portion having a second width, a third portion having a third width and a fourth portion having a fourth width.

The sensing area comprises photoelectric conversion units therein.

The photoelectric conversion unit comprises a photodiode.

The image-sensor structure further comprises color filters formed above the photoelectric conversion units.

The image-sensor structure further comprises a plurality of microlenses formed above the color filters.

The protection layer overlies the microlenses.

The protection layer comprises photoresists.

The first portion and the third portion of the exposed area of the first metal layer are separated by the protection layer.

The second portion and the fourth portion of the exposed area of the first metal layer are separated by the protection layer.

The first portion is connected to the second portion and the fourth portion of the exposed area of the first metal layer.

The third portion is connected to the second portion and the fourth portion of the exposed area of the first metal layer.

The protection layer has a first side, a second side, a third side and a fourth side, which respectively correspond to the first portion, the second portion, the third portion and the fourth portion of the exposed area of the first metal layer.

The image-sensor structure further comprises a second metal layer formed underneath the second surface of the substrate and surrounding the first metal layer.

A shortest horizontal distance from the sensing area to the second metal layer is defined. The first width of the first portion, the second width of the second portion, the third width of the third portion and the fourth width of the fourth portion of the exposed area of the first metal layer are respectively greater than 35 μm and smaller than half of the shortest horizontal distance from the sensing area to the second metal layer.

The image-sensor structure comprises a back-side illuminated image-sensor structure.

One embodiment of the invention provides a method for fabricating an image-sensor structure, comprising: providing a substrate having a first surface and a second surface and comprising a sensing area; forming a first metal layer above the first surface of the substrate and surrounding the sensing area; and forming a protection layer above the first surface of the substrate and overlying the sensing area and a part of the first metal layer.

The fabrication method further comprises forming a second metal layer underneath the second surface of the substrate and surrounding the first metal layer.

The fabrication method further comprises filling a photoresist layer above a plurality of pads disposed in a peripheral scribe line to a sufficient thickness.

The fabrication method further comprises conformally forming a first planarization layer on the photoresist layer, the first metal layer and the first surface of the substrate.

The fabrication method further comprises coating color filter patterns on the first planarization layer within the sensing area.

The fabrication method further comprises forming a plurality of microlenses on a second planarization layer conformally formed on the first planarization layer and the color filter patterns, corresponding to the underneath color filter patterns.

The protection layer is formed on the second planarization layer and overlies the microlenses and a part of the first metal layer to expose a part of the first metal layer uncovered by the protection layer.

The fabrication method further comprises performing an etching process to open the pads and the scribe line.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
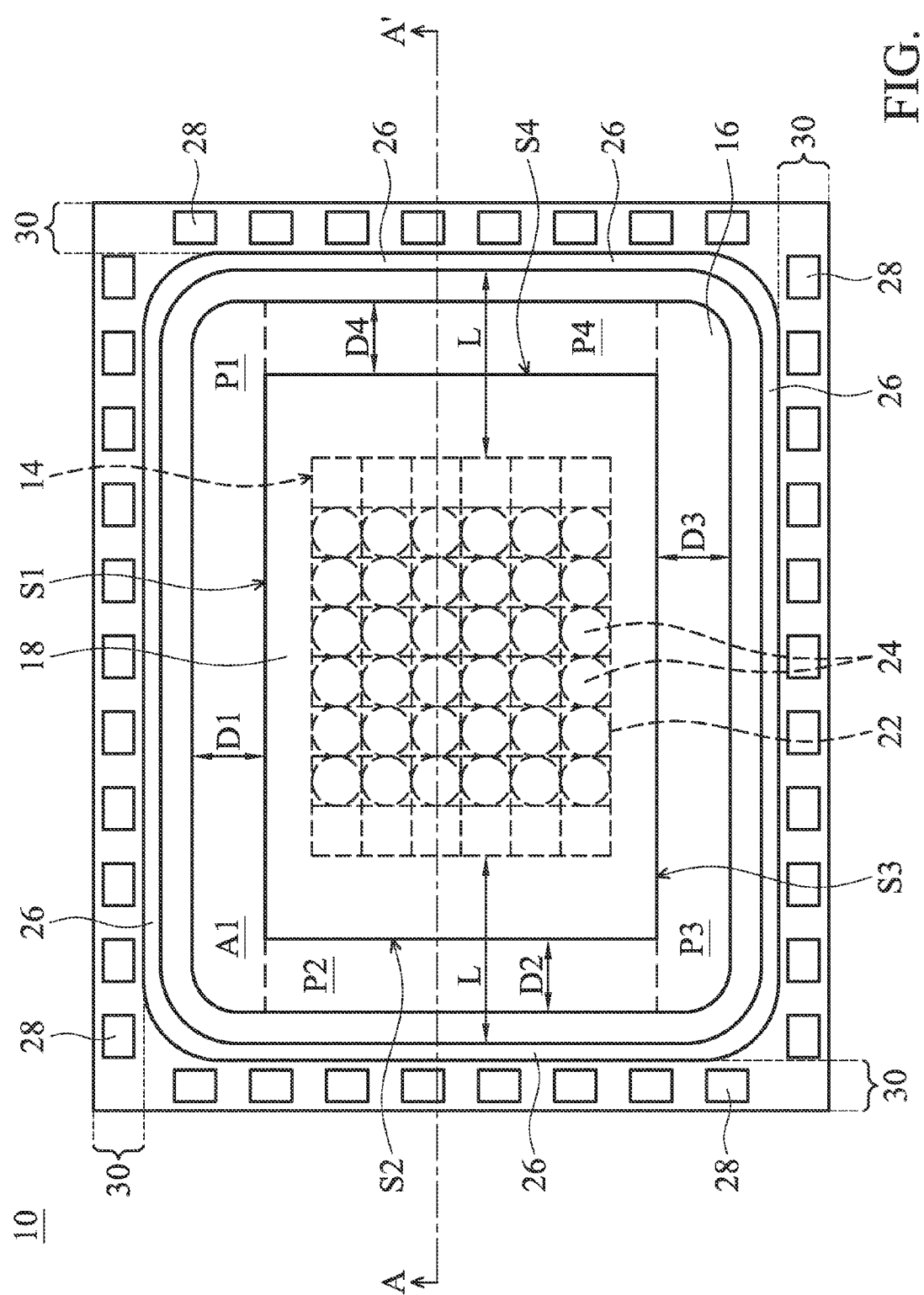
FIG. 1 is a top view of an image-sensor structure in accordance with one embodiment of the invention.
Figure 2:
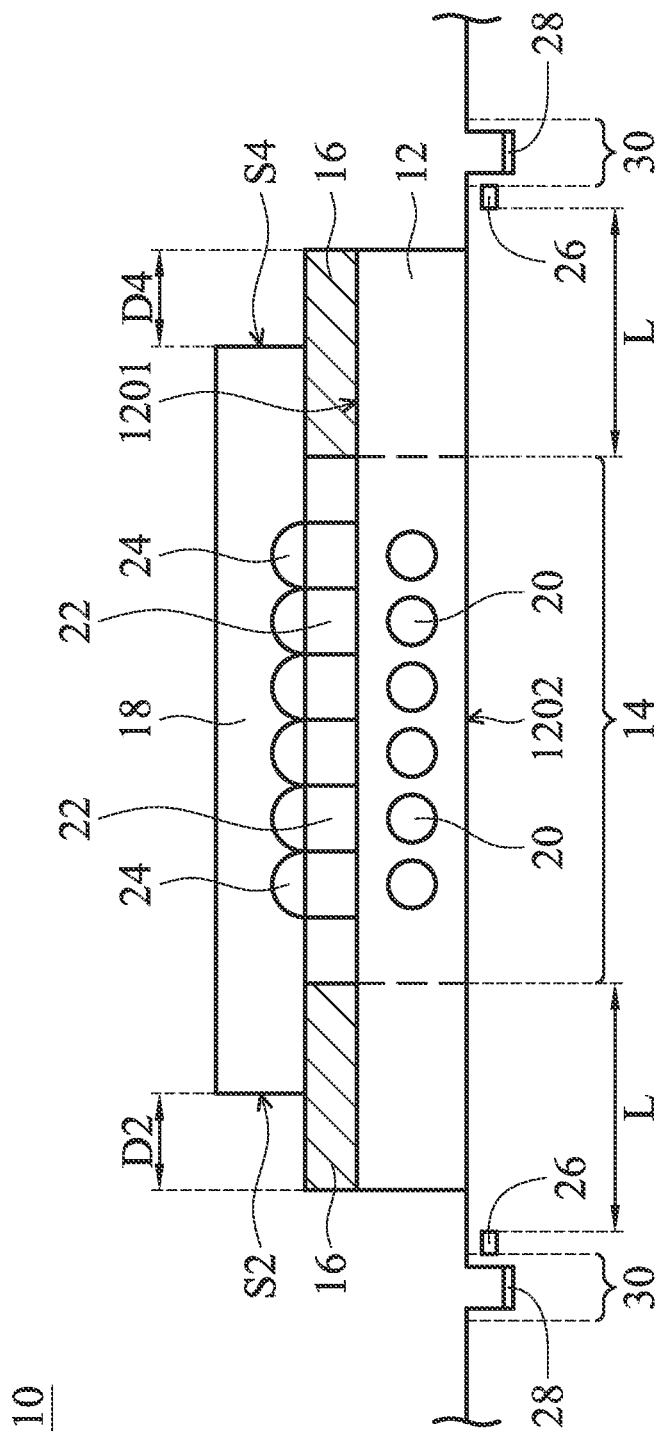
FIG. 2 is a cross-sectional view taken along cross-sectional line A-A' of FIG. 1, which illustrates an image-sensor structure in accordance with one embodiment of the invention.

An image-sensor structure according to one embodiment of the invention is described with reference to FIG. 1 and FIG. 2. FIG. 1 is a top view of the image-sensor structure. FIG. 2 is a cross-sectional view of the image-sensor structure taken along cross-sectional line A-A' of FIG. 1.

Referring to FIGS. 1 and 2, an image-sensor structure 10 is provided. The image-sensor structure 10 comprises a substrate 12 having a first surface 1201 and a second surface 1202 and comprising a sensing area 14, a first metal layer 16 formed above the first surface 1201 of the substrate 12 and surrounding the sensing area 14, and a protection layer 18 formed above the first surface 1201 of the substrate 12 and overlying the sensing area 14 and a part of the first metal layer 16 to expose an exposed area A1 of the first metal layer 16. The exposed area A1 comprises a first portion P1 having a first width D1, a second portion P2 having a second width D2, a third portion P3 having a third width D3 and a fourth portion P4 having a fourth width D4.

In some embodiments, the sensing area 14 may comprise photoelectric conversion units 20 therein.

In some embodiments, the photoelectric conversion unit 20 may comprise a photodiode.

In some embodiments, the image-sensor structure 10 may further comprise color filters 22 formed above the photoelectric conversion units 20.

In some embodiments, the image-sensor structure 10 may further comprise a plurality of microlenses 24 formed above the color filters 22.

In some embodiments, the protection layer 18 overlies the microlenses 24.

In some embodiments, the protection layer 18 may comprise photoresists.

In some embodiments, the first portion P1 and the third portion P3 of the exposed area A1 of the first metal layer 16 may be separated by the protection layer 18.

In some embodiments, the second portion P2 and the fourth portion P4 of the exposed area A1 of the first metal layer 16 may be separated by the protection layer 18.

In some embodiments, the first portion P1 may be connected to the second portion P2 and the fourth portion P4 of the exposed area A1 of the first metal layer 16.

In some embodiments, the third portion P3 may be connected to the second portion P2 and the fourth portion P4 of the exposed area A1 of the first metal layer 16.

In some embodiments, the protection layer 18 has a first side S1, a second side S2, a third side S3 and a fourth side S4, which respectively correspond to the first portion P1, the second portion P2, the third portion P3 and the fourth portion P4 of the exposed area A1 of the first metal layer 16.

In some embodiments, the image-sensor structure 10 may further comprise a second metal layer 26 formed underneath the second surface 1202 of the substrate 12 and surrounding the first metal layer 16.

A shortest horizontal distance L from the sensing area 14 to the second metal layer 26 is defined. The first width D1 of the first portion P1, the second width D2 of the second portion P2, the third width D3 of the third portion P3 and the fourth width D4 of the fourth portion P4 of the exposed area A1 of the first metal layer 16 are respectively greater than 35 µm and smaller than L/2 (half of the shortest horizontal distance L from the sensing area 14 to the second metal layer 26).

In this embodiment, the first width D1 of the first portion P1 is similar to the third width D3 of the third portion P3 of the exposed area A1 of the first metal layer 16. The second width D2 of the second portion P2 is similar to the fourth width D4 of the fourth portion P4 of the exposed area A1 of the first metal layer 16.

In some embodiments, the image-sensor structure 10 may further comprise a plurality of pads 28 disposed in a peripheral scribe line 30.

In some embodiments, the image-sensor structure 10 may comprise a back-side illuminated image-sensor structure.

Figure 3:
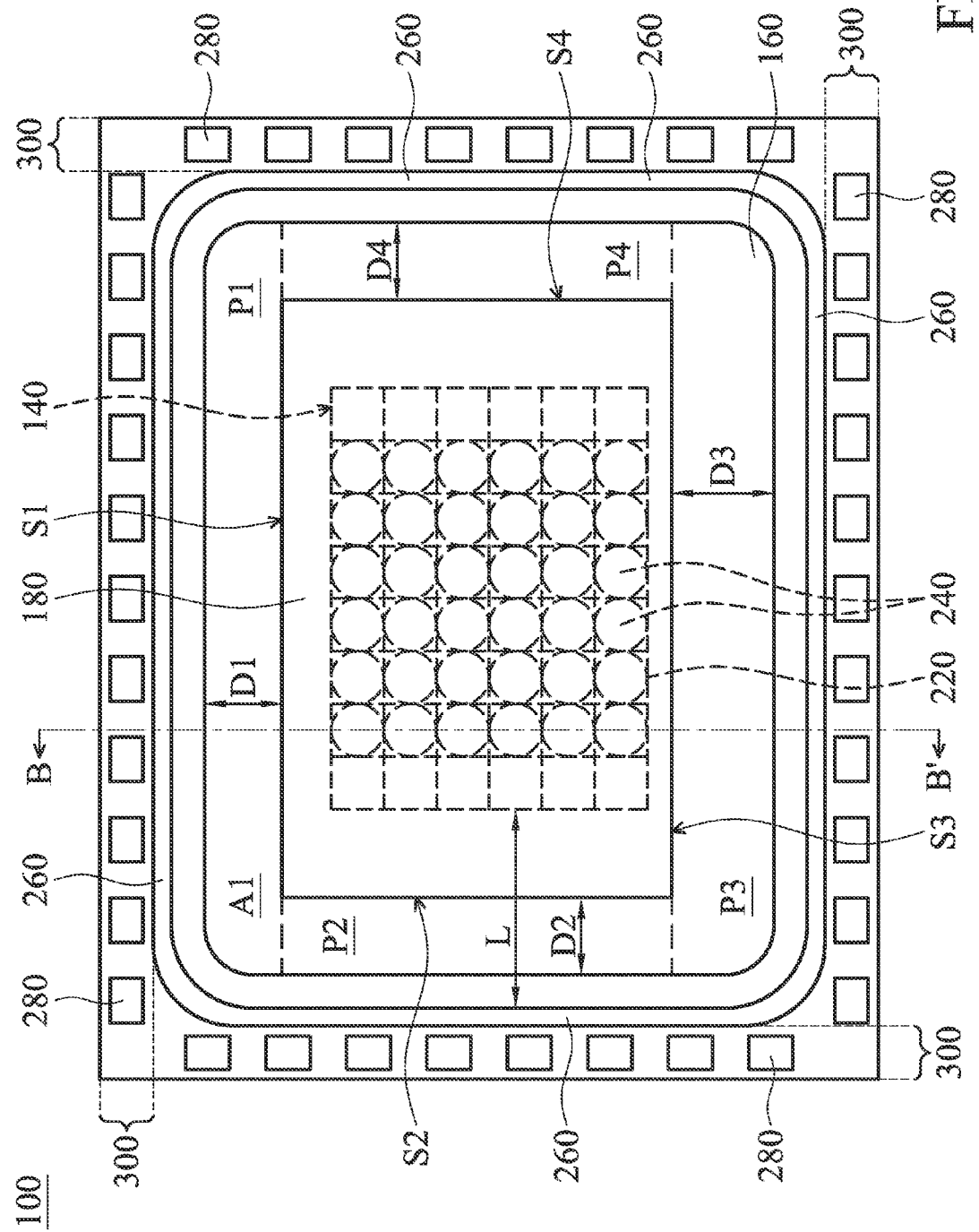
FIG. 3 is a top view of an image-sensor structure in accordance with one embodiment of the invention.
Figure 4:
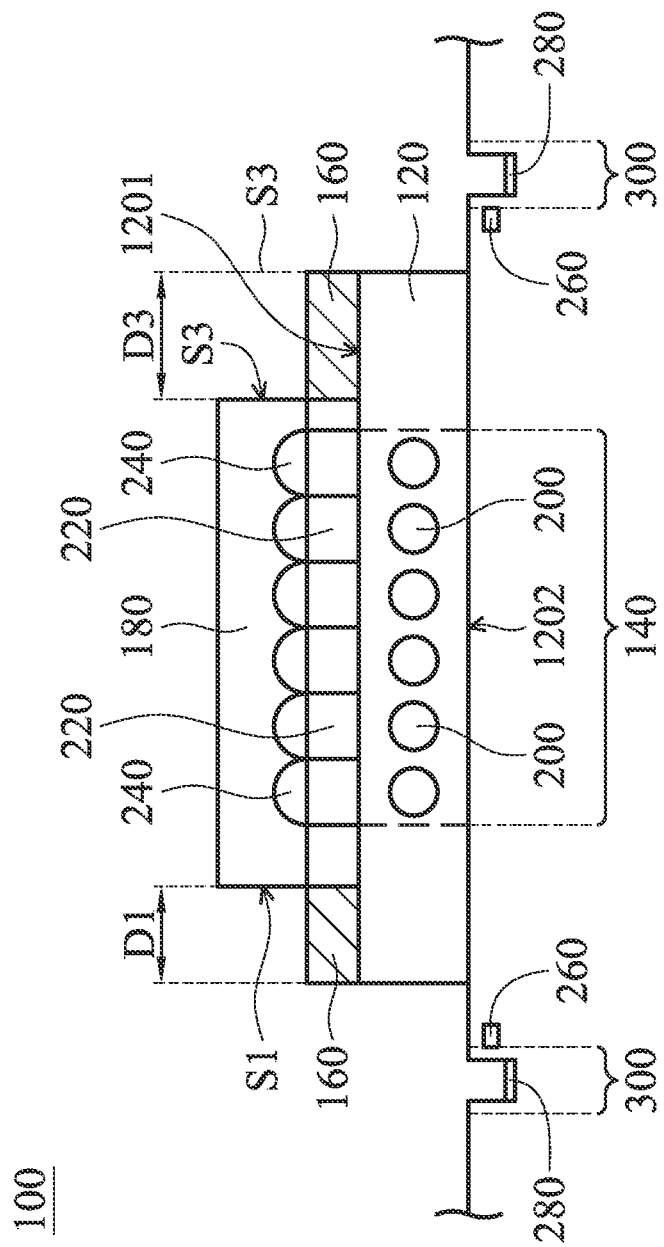
FIG. 4 is a cross-sectional view taken along cross-sectional line B-B' of FIG. 3, which illustrates an image-sensor structure in accordance with one embodiment of the invention.

An image-sensor structure according to one embodiment of the invention is described with reference to FIG. 3 and FIG. 4. FIG. 3 is a top view of the image-sensor structure. FIG. 4 is a cross-sectional view of the image-sensor structure taken along cross-sectional line B-B' of FIG. 3.

Referring to FIGS. 3 and 4, an image-sensor structure 100 is provided. The image-sensor structure 100 comprises a substrate 120 having a first surface 1201 and a second surface 1202 and comprising a sensing area 140, a first metal layer 160 formed above the first surface 1201 of the substrate 120 and surrounding the sensing area 140, and a protection layer 180 formed above the first surface 1201 of the substrate 120 and overlying the sensing area 140 and a part of the first metal layer 160 to expose an exposed area A1 of the first metal layer 160. The exposed area A1 comprises a first portion P1 having a first width D1, a second portion P2 having a second width D2, a third portion P3 having a third width D3 and a fourth portion P4 having a fourth width D4.

In some embodiments, the sensing area 140 may comprise photoelectric conversion units 200 therein.

In some embodiments, the photoelectric conversion unit 200 may comprise a photodiode.

In some embodiments, the image-sensor structure 100 may further comprise color filters 220 formed above the photoelectric conversion units 200.

In some embodiments, the image-sensor structure 100 may further comprise a plurality of microlenses 240 formed above the color filters 220.

In some embodiments, the protection layer 180 overlies the microlenses 240.

In some embodiments, the protection layer 180 may comprise photoresists.

In some embodiments, the first portion P1 and the third portion P3 of the exposed area A1 of the first metal layer 160 may be separated by the protection layer 180.

In some embodiments, the second portion P2 and the fourth portion P4 of the exposed area A1 of the first metal layer 160 may be separated by the protection layer 180.

In some embodiments, the first portion P1 may be connected to the second portion P2 and the fourth portion P4 of the exposed area A1 of the first metal layer 160.

In some embodiments, the third portion P3 may be connected to the second portion P2 and the fourth portion P4 of the exposed area A1 of the first metal layer 160.

In some embodiments, the protection layer 180 has a first side S1, a second side S2, a third side S3 and a fourth side S4, which respectively correspond to the first portion P1, the second portion P2, the third portion P3 and the fourth portion P4 of the exposed area A1 of the first metal layer 160.

In some embodiments, the image-sensor structure 100 may further comprise a second metal layer 260 formed underneath the second surface 1202 of the substrate 120 and surrounding the first metal layer 160.

A shortest horizontal distance L from the sensing area 140 to the second metal layer 260 is defined. The first width D1 of the first portion P1, the second width D2 of the second portion P2, the third width D3 of the third portion P3 and the fourth width D4 of the fourth portion P4 of the exposed area A1 of the first metal layer 160 are respectively greater than 35 µm and smaller than L/2 (half of the shortest horizontal distance L from the sensing area 140 to the second metal layer 260).

In this embodiment, the third width D3 of the third portion P3 is larger than the first width D1 of the first portion P1 of the exposed area A1 of the first metal layer 160. The second width D2 of the second portion P2 is similar to the fourth width D4 of the fourth portion P4 of the exposed area A1 of the first metal layer 160.

In some embodiments, the image-sensor structure 100 may further comprise a plurality of pads 280 disposed in a peripheral scribe line 300.

In some embodiments, the image-sensor structure 100 may comprise a back-side illuminated image-sensor structure.

Figure 5:
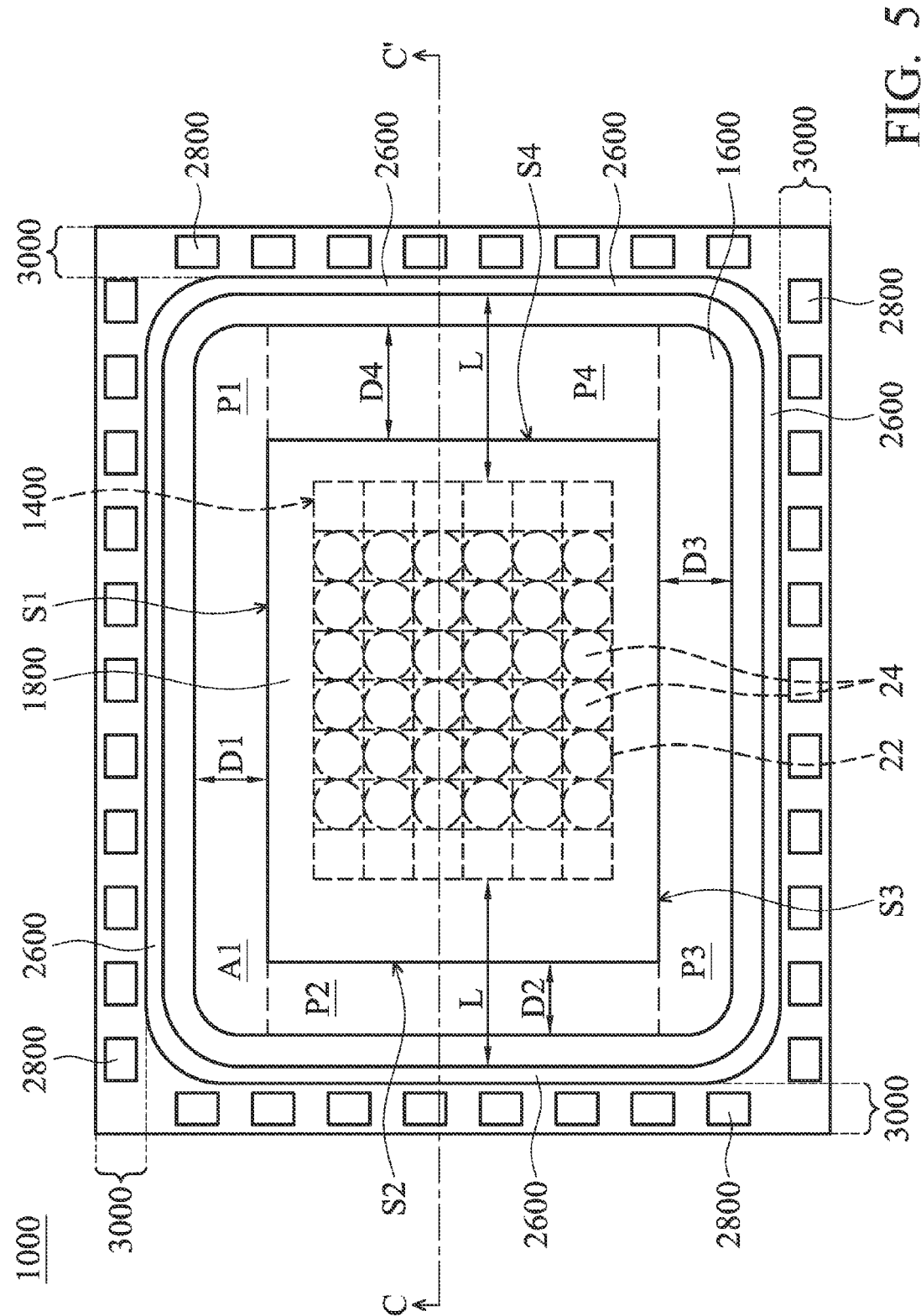
FIG. 5 is a top view of an image-sensor structure in accordance with one embodiment of the invention.
Figure 6:
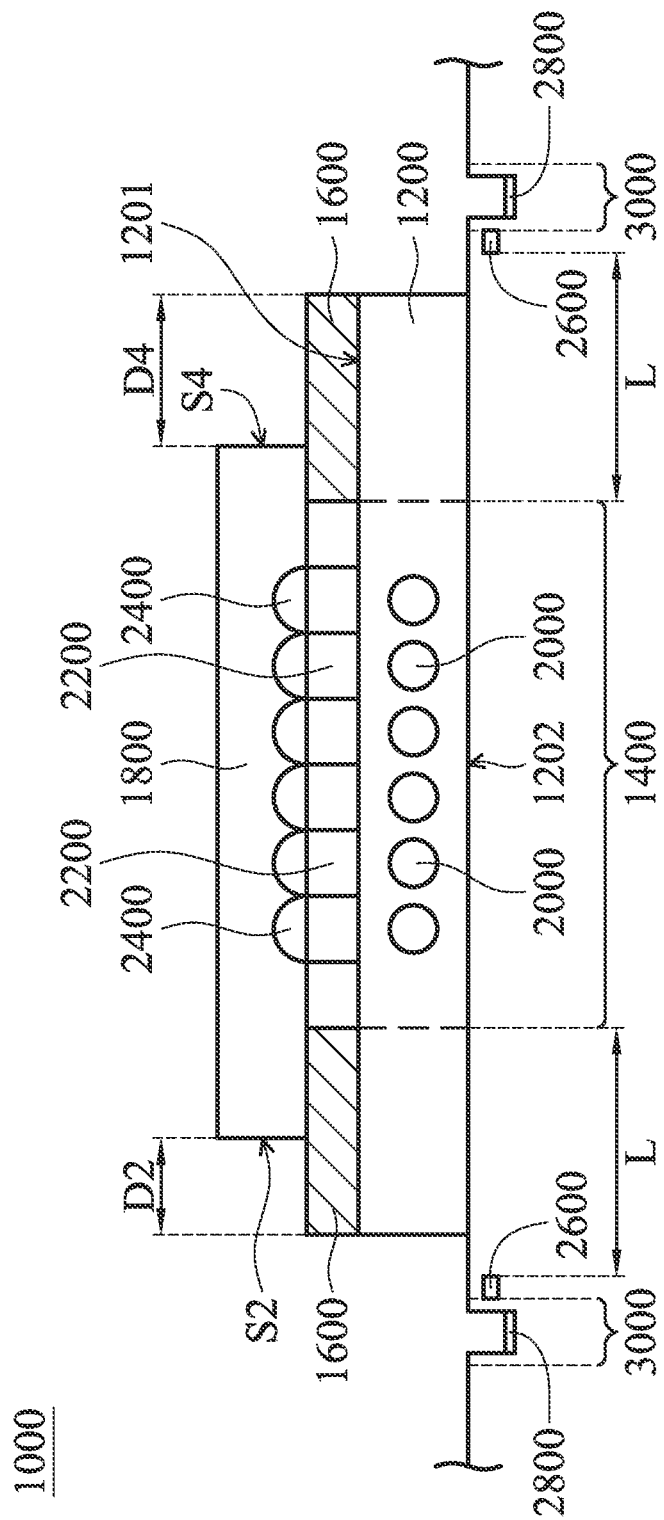
FIG. 6 is a cross-sectional view taken along cross-sectional line C-C' of FIG. 5, which illustrates an image-sensor structure in accordance with one embodiment of the invention.

An image-sensor structure according to one embodiment of the invention is described with reference to FIG. 5 and FIG. 6. FIG. 5 is a top view of the image-sensor structure. FIG. 6 is a cross-sectional view of the image-sensor structure taken along cross-sectional line C-C' of FIG. 5.

Referring to FIGS. 5 and 6, an image-sensor structure 1000 is provided. The image-sensor structure 1000 comprises a substrate 1200 having a first surface 1201 and a second surface 1202 and comprising a sensing area 1400, a first metal layer 1600 formed above the first surface 1201 of the substrate 1200 and surrounding the sensing area 1400, and a protection layer 1800 formed above the first surface 1201 of the substrate 1200 and overlying the sensing area 1400 and a part of the first metal layer 1600 to expose an exposed area A1 of the first metal layer 1600. The exposed area A1 comprises a first portion P1 having a first width D1, a second portion P2 having a second width D2, a third portion P3 having a third width D3 and a fourth portion P4 having a fourth width D4.

In some embodiments, the sensing area 1400 may comprise photoelectric conversion units 2000 therein.

In some embodiments, the photoelectric conversion unit 2000 may comprise a photodiode.

In some embodiments, the image-sensor structure 1000 may further comprise color filters 2200 formed above the photoelectric conversion units 2000.

In some embodiments, the image-sensor structure 1000 may further comprise a plurality of microlenses 2400 formed above the color filters 2200.

In some embodiments, the protection layer 1800 overlies the microlenses 2400.

In some embodiments, the protection layer 1800 may comprise photoresists.

In some embodiments, the first portion P1 and the third portion P3 of the exposed area A1 of the first metal layer 1600 may be separated by the protection layer 1800.

In some embodiments, the second portion P2 and the fourth portion P4 of the exposed area A1 of the first metal layer 1600 may be separated by the protection layer 1800.

In some embodiments, the first portion P1 may be connected to the second portion P2 and the fourth portion P4 of the exposed area A1 of the first metal layer 1600.

In some embodiments, the third portion P3 may be connected to the second portion P2 and the fourth portion P4 of the exposed area A1 of the first metal layer 1600.

In some embodiments, the protection layer 1800 has a first side S1, a second side S2, a third side S3 and a fourth side S4, which respectively correspond to the first portion P1, the second portion P2, the third portion P3 and the fourth portion P4 of the exposed area A1 of the first metal layer 1600.

In some embodiments, the image-sensor structure 1000 may further comprise a second metal layer 2600 formed underneath the second surface 1202 of the substrate 1200 and surrounding the first metal layer 1600.

A shortest horizontal distance L from the sensing area 1400 to the second metal layer 2600 is defined. The first width D1 of the first portion P1, the second width D2 of the second portion P2, the third width D3 of the third portion P3 and the fourth width D4 of the fourth portion P4 of the exposed area A1 of the first metal layer 1600 are respectively greater than 35 µm and smaller than L/2 (half of the shortest horizontal distance L from the sensing area 1400 to the second metal layer 2600).

In this embodiment, the first width D1 of the first portion P1 is similar to the third width D3 of the third portion P3 of the exposed area A1 of the first metal layer 1600. The fourth width D4 of the fourth portion P4 is larger than the second width D2 of the second portion P2 of the exposed area A1 of the first metal layer 1600.

In some embodiments, the image-sensor structure 1000 may further comprise a plurality of pads 2800 disposed in a peripheral scribe line 3000.

In some embodiments, the image-sensor structure 1000 may comprise a back-side illuminated image-sensor structure.

A method for fabricating an image-sensor structure according to one embodiment of the invention is described with reference to FIGS. 7A-7H which are cross-sectional views of the fabrication method.

Figure 7A:
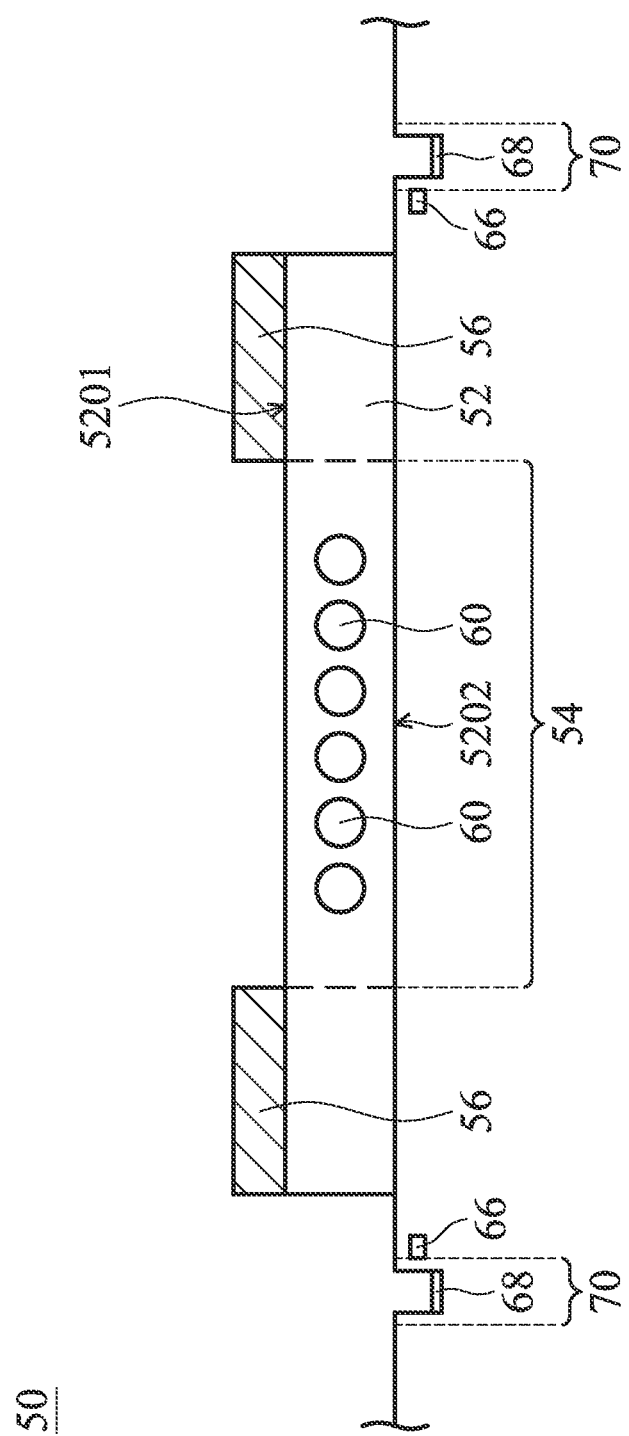
FIGS. 7A-7H are cross-sectional views of a method for fabricating an image-sensor structure in accordance with one embodiment of the invention.

Referring to FIG. 7A, a substrate structure 50 is provided. The substrate structure 50 comprises a substrate 52 having a first surface 5201 and a second surface 5202 and comprising a sensing area 54, a first metal layer 56 formed above the first surface 5201 of the substrate 52 and surrounding the sensing area 54. The sensing area 54 may comprise photoelectric conversion units 60 therein. The photoelectric conversion unit 60 may comprise a photodiode. The substrate structure 50 may further comprise a second metal layer 66 formed underneath the second surface 5202 of the substrate 52 and surrounding the first metal layer 56. The substrate structure 50 may further comprise a plurality of pads 68 disposed in a peripheral scribe line 70.

Figure 7B:
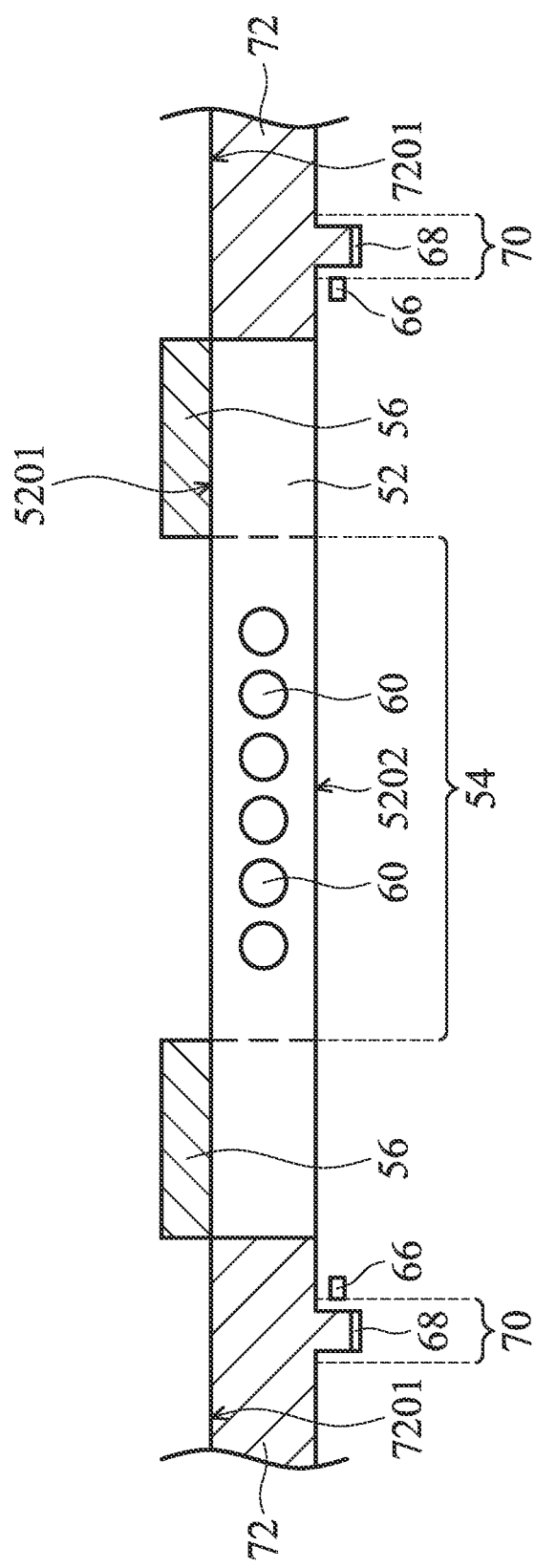

Referring to FIG. 7B, a photoresist layer 72 is filled above the pads 68 to a sufficient thickness such that the surface 7201 of the photoresist layer 72 is level with the first surface 5201 of the substrate 52.

Figure 7C:
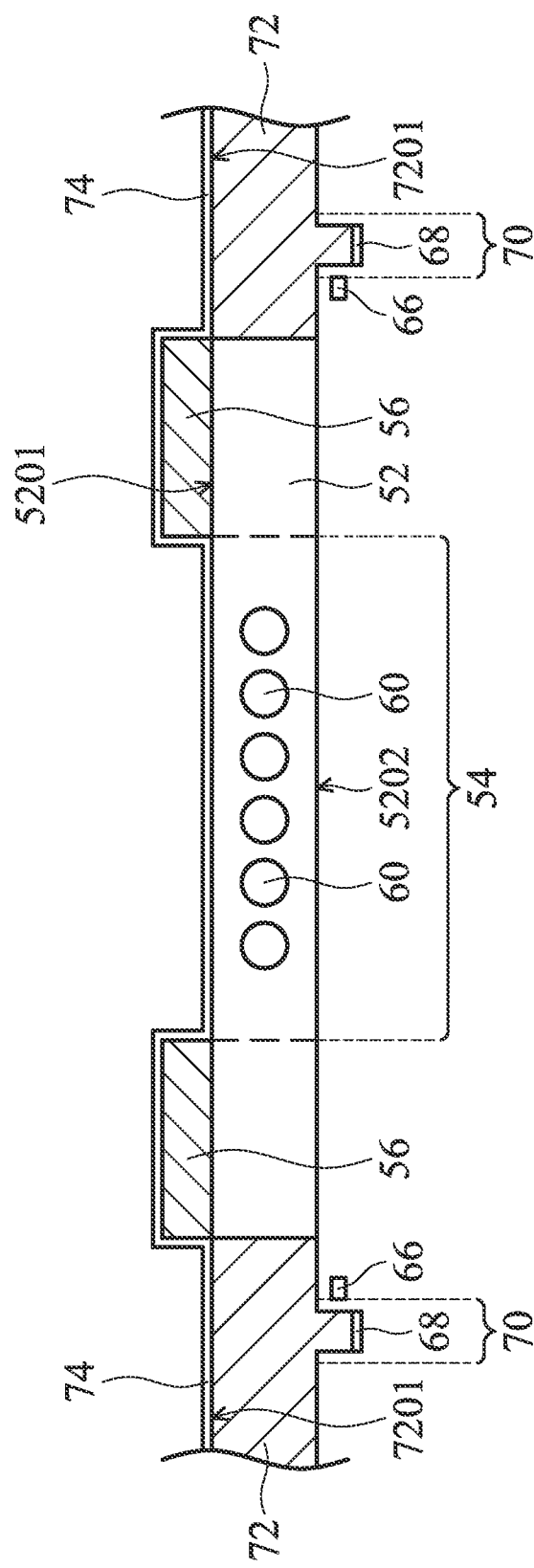

Referring to FIG. 7C, a first planarization layer 74, for example a photoresist layer, an oxide layer, a nitride layer or an oxynitride layer, is conformally formed on the photoresist layer 72, the first metal layer 56 and the first surface 5201 of the substrate 52.

Figure 7D:
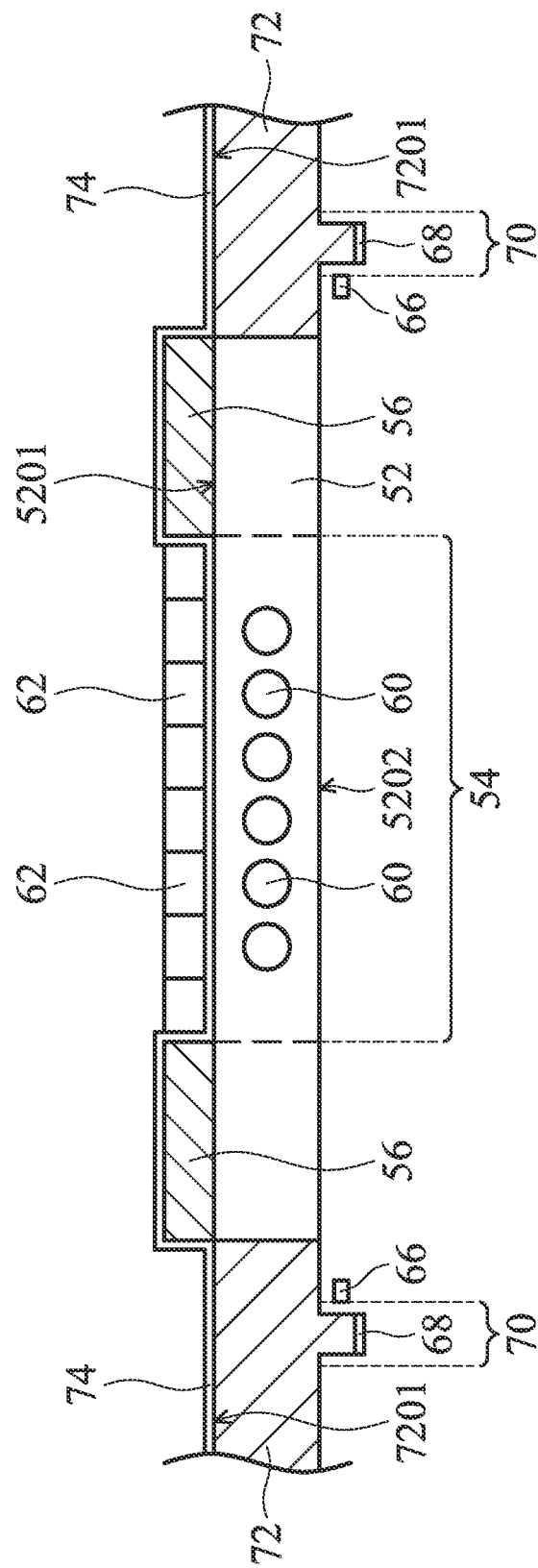

Referring to FIG. 7D, color filter patterns 62, for example red (R) color filter patterns, blue (B) color filter patterns and green (G) color filter patterns, are coated on the first planarization layer 74, corresponding to the underneath photoelectric conversion units 60 within the sensing area 54.

Figure 7E:
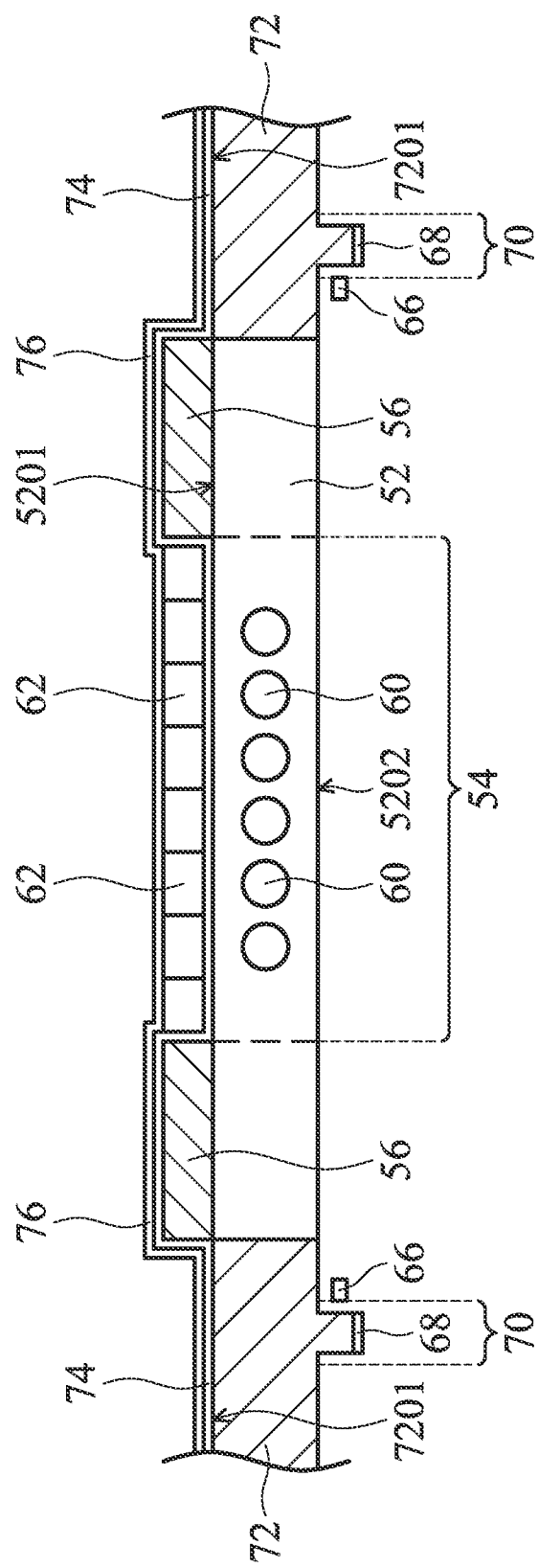

Referring to FIG. 7E, a second planarization layer 76, for example a photoresist layer, an oxide layer, a nitride layer or an oxynitride layer, is conformally formed on the first planarization layer 74 and the color filter patterns 62.

Figure 7F:
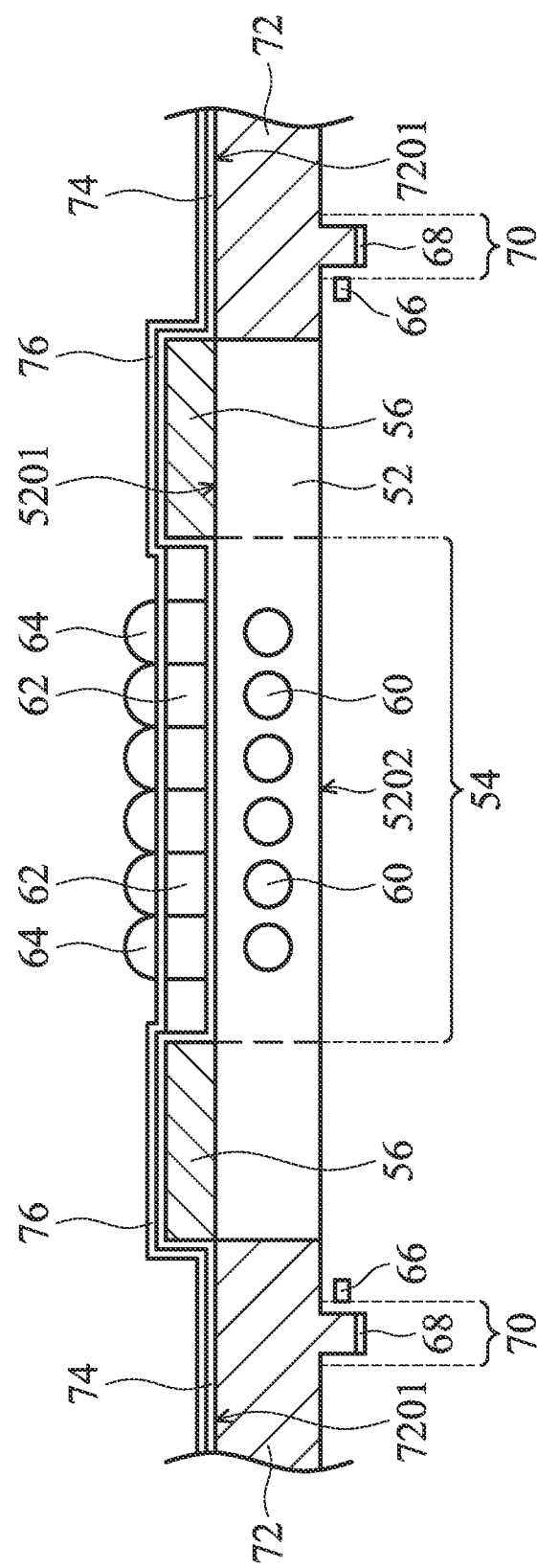

Referring to FIG. 7F, a plurality of microlenses 64 are formed on the second planarization layer 76, corresponding to the underneath color filter patterns 62.

Figure 7G:
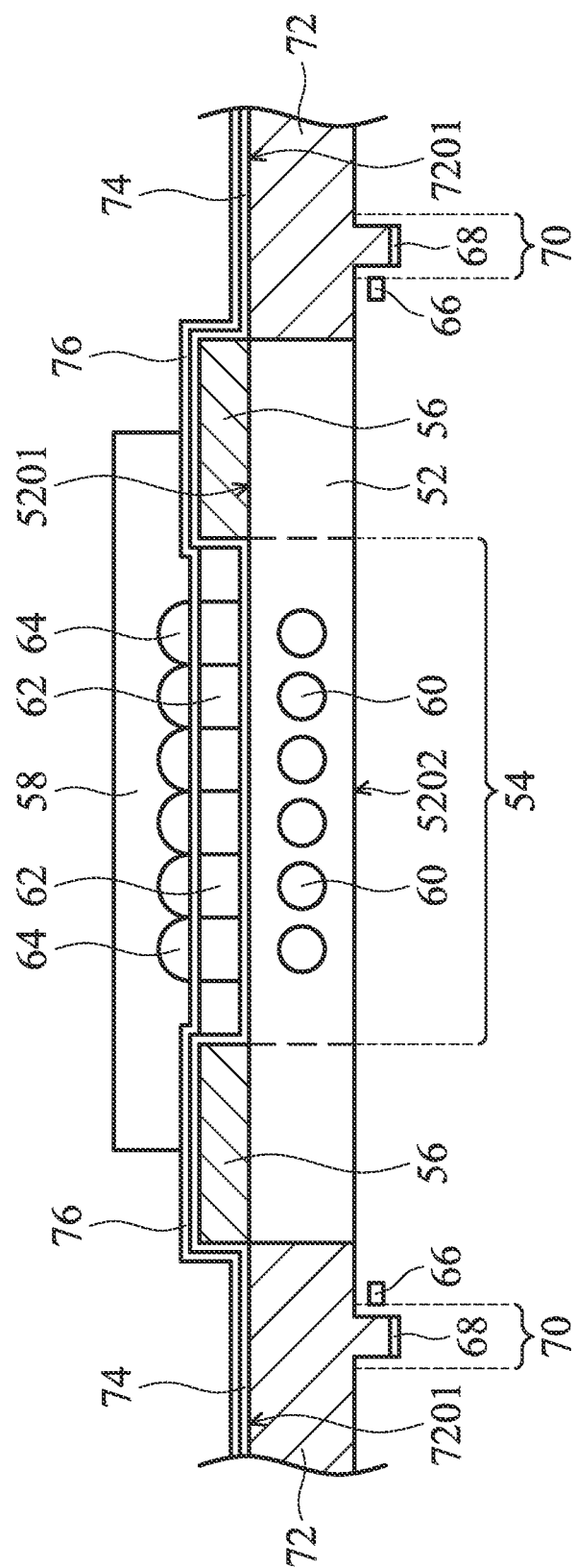

Referring to FIG. 7G, a patterned protection layer 58, for example a patterned photoresist layer, is formed on the second planarization layer 76 and overlies the microlenses 64 and a part of the first metal layer 56 through, for example a process of coating, exposing and developing (lithography), to expose a part of the first metal layer 56 (exposed area) uncovered by the patterned protection layer 58. The profiles of the exposed area of the first metal layer 56 are similar to those of FIGS. 1, 3 and 5.

Figure 7H:
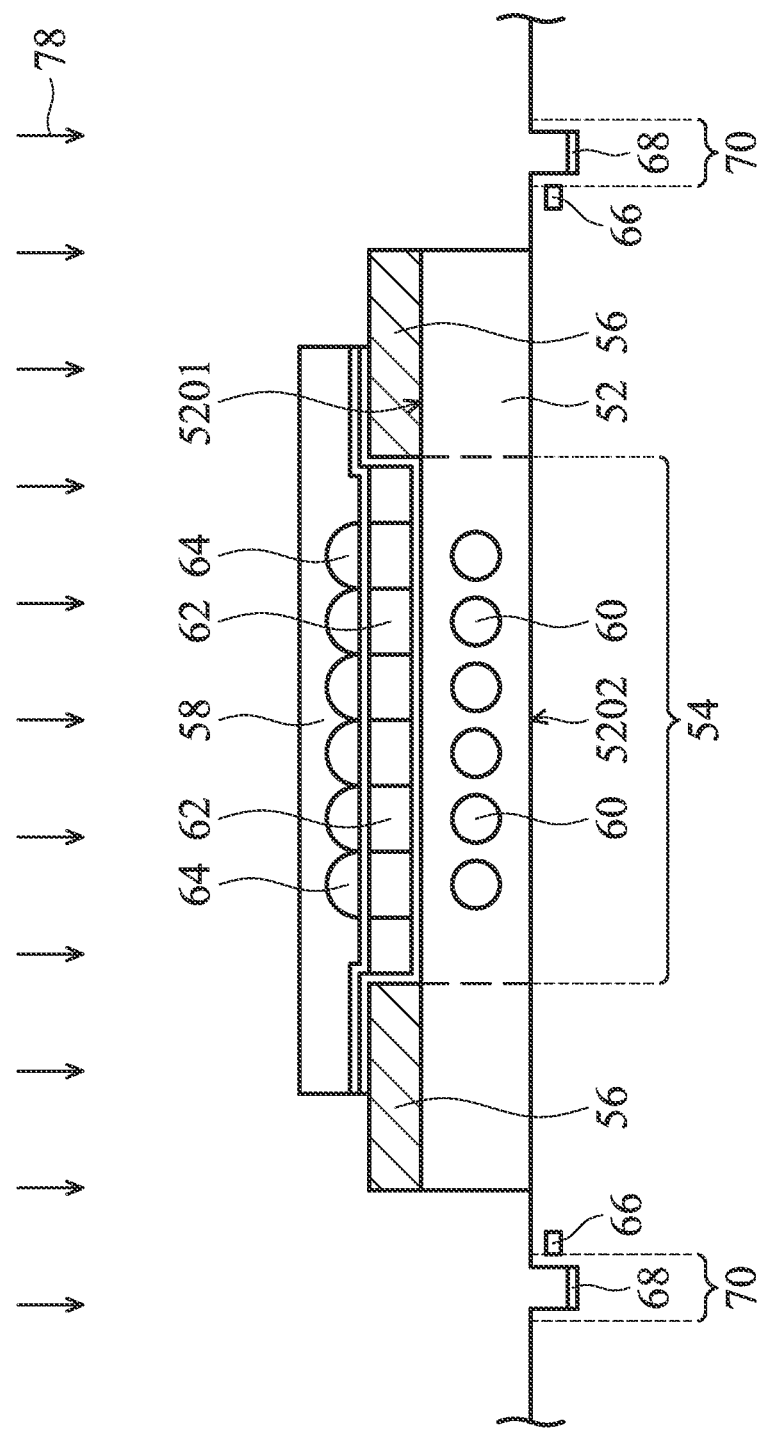

Referring to FIG. 7H, an etching process 78, for example plasma etching, is performed to open the pads 68 and the scribe line 70 for subsequent electrical testing.

Figure 8:
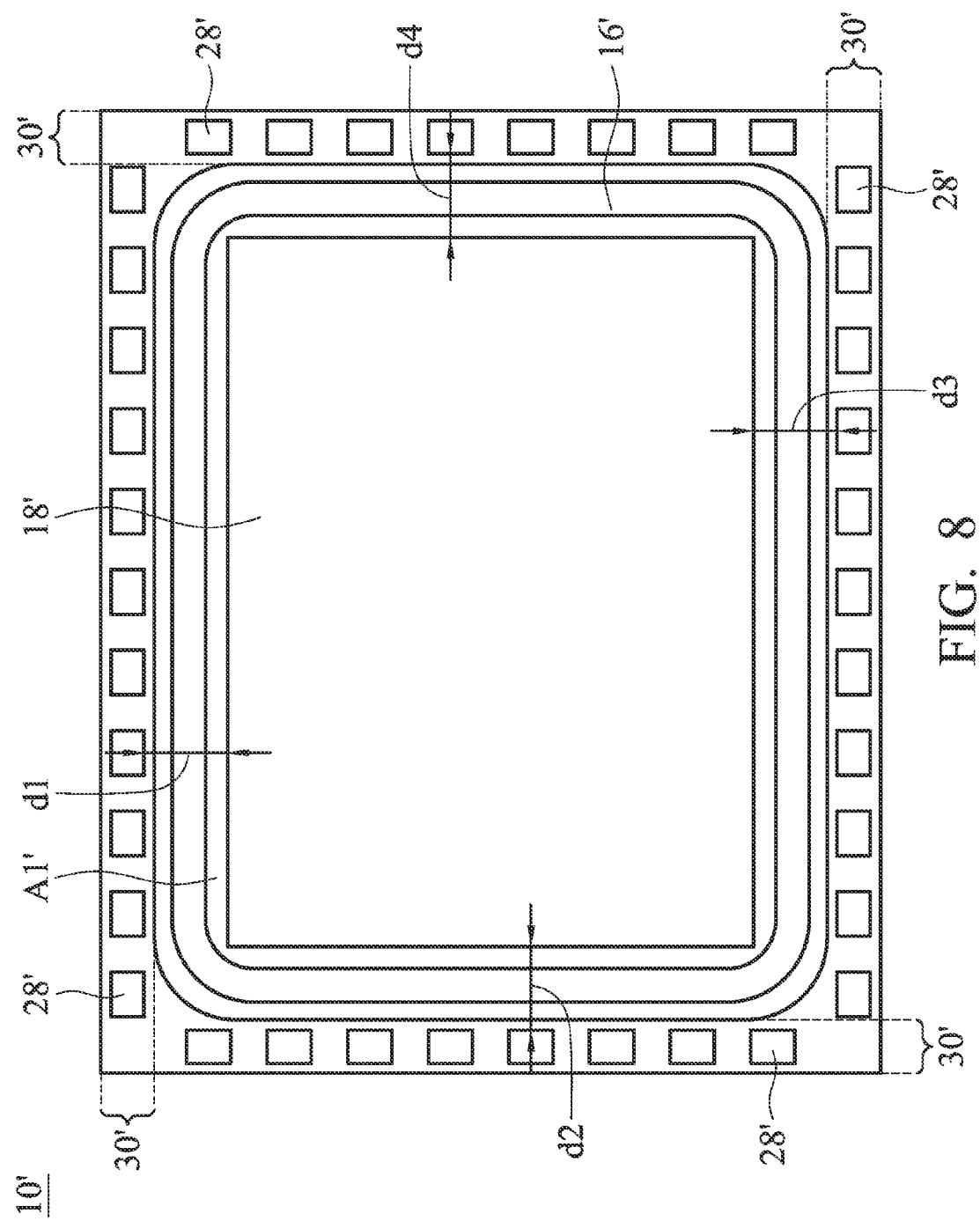
FIG. 8 is a top view of a conventional image-sensor structure.

Referring to FIG. 8, in a conventional image-sensor structure 10', a design for distances between a protection layer 18' and bond pads 28' is $d_1$, $d_2$, $d_3$, and $d_4$. When an etching process is performed to open the bond pads 28' and scribe line 30', electrostatic charges accumulate on an exposed area A1' of a first metal layer 16' (marginal back-side metal (BME)). However, these electrostatic charges are then easily discharged to pass through the substrate, causing damage (suffering an electrostatic discharge (ESD) issue) because of the short distances $d_1$, $d_2$, $d_3$, $d_4$ and the exposed area A1'. Conversely, in the present image-sensor structure 10 (as shown in FIG. 1), a design for the widths of the exposed area A1 of the first metal layer 16 includes $D_1$, $D_2$, $D_3$, and $D_4$. When an etching process is performed to open the pads 28 and scribe line 30, although electrostatic charges still accumulate on the exposed area A1 of the first metal layer 16 (marginal back-side metal (BME)), these electrostatic charges remain on the back-side metal (BME) without passing through and damaging the substrate (prevention from the electrostatic discharge (ESD) issue) due to the sufficiently large widths $D_1$, $D_2$, $D_3$, $D_4$ and the exposed area A1. Specifically, $D_1$ may be about 1.5 times $d_1$, $D_2$ may be about 1.5 times $d_2$, $D_3$ may be about 1.5 times $d_3$, and $D_4$ may be about 1.5 times $d_4$.

While the invention has been described by way of example and in terms of preferred embodiment, it is to be understood that the invention is not limited thereto. On the contrary, it is intended to cover various modifications and similar arrangements (as may be apparent to those skilled in the art). Therefore, the scope of the appended claims should be accorded the broadest interpretation so as to encompass all such modifications and similar arrangements.

What is claimed is:

1. An image-sensor structure, comprising:
a substrate having a first surface and a second surface and comprising a sensing area;
a first metal layer formed above the first surface of the substrate and surrounding the sensing area; and
a protection layer formed above the first surface of the substrate and overlying the sensing area and a part of the first metal layer to expose an exposed area of the first metal layer, wherein the exposed area comprises a first portion having a first width, a second portion having a second width, a third portion having a third width and a fourth portion having a fourth width, wherein the first width of the first portion, the second width of the second portion, the third width of the third portion and the fourth width of the fourth portion of the exposed area of the first metal layer are respectively greater than 35 µm.

2. The image-sensor structure as claimed in claim 1, further comprising a second metal layer formed underneath the second surface of the substrate of a substrate structure.

3. The image-sensor structure as claimed in claim 2, wherein a shortest horizontal distance from the sensing area to the second metal layer is defined.

4. The image-sensor structure as claimed in claim 1, wherein a distance between the protection layer and a bond pad is defined.

5. The image-sensor structure as claimed in claim 1, further comprising color filters formed above photoelectric conversion units comprising photodiodes in the sensing area.

6. The image-sensor structure as claimed in claim 5, wherein the protection layer overlies a plurality of microlenses formed above the color filters.

7. The image-sensor structure as claimed in claim 1, wherein the protection layer comprises photoresists.

8. The image-sensor structure as claimed in claim 1, wherein the first portion and the third portion of the exposed area of the first metal layer are separated by the protection layer, and the second portion and the fourth portion of the exposed area of the first metal layer are separated by the protection layer.

9. The image-sensor structure as claimed in claim 1, wherein the first portion is connected to the second portion and the fourth portion of the exposed area of the first metal layer, and the third portion is connected to the second portion and the fourth portion of the exposed area of the first metal layer.

10. The image-sensor structure as claimed in claim 1, wherein the protection layer has a first side, a second side, a third side and a fourth side, which respectively correspond to the first portion, the second portion, the third portion and the fourth portion of the exposed area of the first metal layer.

11. An image-sensor structure, comprising:
a substrate having a first surface and a second surface and comprising a sensing area;
a first metal layer formed above the first surface of the substrate and surrounding the sensing area;
a second metal layer formed underneath the second surface of the substrate; and
a protection layer formed above the first surface of the substrate and overlying the sensing area and a part of the first metal layer to expose an exposed area of the first metal layer, wherein the exposed area comprises a first portion having a first width, a second portion having a second width, a third portion having a third width and a fourth portion having a fourth width, wherein a shortest horizontal distance from the sensing area to the second metal layer is defined, and half of the shortest horizontal distance from the sensing area to the second metal layer is greater than the first width of the first portion, the second width of the second portion, the third width of the third portion and the fourth width of the fourth portion of the exposed area of the first metal layer.

* * * * *